United States Patent
Baba

[19]

[11] Patent Number: 6,016,013
[45] Date of Patent: Jan. 18, 2000

[54] SEMICONDUCTOR DEVICE MOUNTING STRUCTURE

[75] Inventor: Mikio Baba, Tokyo, Japan

[73] Assignee: NEC Corporation, Japan

[21] Appl. No.: 08/915,272

[22] Filed: Aug. 20, 1997

[30] Foreign Application Priority Data

Aug. 20, 1996 [JP] Japan ................................. 8-218351

[51] Int. Cl.[7] .......................... H01L 23/48; H01L 23/52; H01L 29/40
[52] U.S. Cl. .................... 257/778; 257/783; 257/738; 228/180.22
[58] Field of Search .................................. 257/778, 777, 257/783, 737, 738; 228/180.22; 438/108, 736

[56] References Cited

U.S. PATENT DOCUMENTS

| | | | |
|---|---|---|---|
| 4,336,551 | 6/1982 | Fujita et al. ........................... | 257/666 |
| 4,764,804 | 8/1988 | Sahara et al. ........................... | 257/778 |
| 4,887,760 | 12/1989 | Yoshimo et al. ........................ | 257/666 |
| 5,203,075 | 4/1993 | Angulas et al. ........................ | 257/666 |
| 5,534,465 | 7/1996 | Frye et al. ............................... | 257/778 |
| 5,600,180 | 2/1997 | Kusaka et al. ........................... | 257/666 |
| 5,757,078 | 5/1998 | Matsuda et al. ........................ | 257/666 |

FOREIGN PATENT DOCUMENTS

| | | | |
|---|---|---|---|
| 4-312935 | 11/1992 | Japan ..................................... | 257/783 |
| 6291165 | 10/1994 | Japan ............................. | H01L 21/60 |

OTHER PUBLICATIONS

"Past: Why MCM is needed?" (Original source and issue date unknown).

*Primary Examiner*—Valencia Martin-Wallace
*Assistant Examiner*—Jhihan B. Clark
*Attorney, Agent, or Firm*—Hayes, Soloway, Hennessey, Grossman & Hage, P.C.

[57] ABSTRACT

Insulating resin layers are formed respectively so as to cover electrical pads for the purpose of connecting metal bumps of a semiconductor device and a mounting board, metal bump electrode pads being formed on the surface of these insulating resin layers, so that the electrode pads are electrically connected to one another. Thermal stress between the semiconductor device and the mounting board is absorbed by the insulating resin layers, the influence felt on the metal bumps being alleviated, thereby achieving an improvement in the reliability of the connection made by the metal bumps.

15 Claims, 3 Drawing Sheets

SEMICONDUCTOR DEVICE MOUNTING STRUCTURE

BACKGROUND OF THE INVENTION

1. Field of the Invention

The present invention relates to a structure for mounting a semiconductor device onto a mounting board such as a multilayer printed circuit board, and more specifically to a mounting structure of flip-chip construction for mounting a semiconductor chip using metal bumps.

2. Description of Related Art

In flip-chip connection structures in the past, metallic bumps such as solder bumps were generally used, a small solder piece being applied to the electrode pads on one side of the semiconductor device and the multilayer printed circuit board, solder being applied thereto by printing the solder, and causing the solder to melt, the surface tension thereof forming a spherically shaped solder bump.

Then, the electrode pads of the multilayer printed circuit board and semiconductor device which are in opposition to the thus formed solder bumps are superposed thereover and aligned therewith, reflow or other thermal processing is then used to melt the solder bumps and make connections to opposing electrode pads.

FIG. 4 shows an example of the cross section of the above-noted arrangement. In this drawing, a first electrode pad 2 is formed around the periphery of a semiconductor device 1, a second electrode pad 9 is formed on the surface of the multilayer printed circuit board 8, for the purpose of mounting this semiconductor device 1 which is formed of Al2O3 or the like, and a metal bump 14 made of solder is used to make a joining therebetween.

However, in a connection structure such as this which uses a solder bump a problem arises in that with the application of thermal hysteresis causes heat stress to develop at the bump connection part due to a difference in thermal expansion between the semiconductor device 1 and the multilayer printed circuit board 8, and as the size of the semiconductor device grows large, this thermal stress becomes large, leading to destruction of the bump connection part due to fatigue.

Because of the above-noted problem, there was a connection structure proposed in Japanese Unexamined Patent Publication (KOKAI) No. 6-291165, this being shown in FIG. 5.

This structure is formed by a first electrode pad 2 which is provided on the semiconductor device 1, a second electrode pad 9 which is provided on a multilayer printed circuit board 8, and an insulating film 30 which intervenes between the above-noted first and second electrode pad 2 and 9, bumps 14 making connection of their respective first and second electrode pads 2 and 9 with via the insulating film 30.

This insulating film 30 has an electrode pads 31 on its front and reverse sides at positions which are not mutually opposite, these electrode pads 31 on the insulating film 30 being electrically connected by means of the through holes 32 and lead wires 33.

The first electrode pad 2 of the semiconductor device 1 and the electrode pad 31 on the front surface of the insulating film 30 are connected by means of the solder bump 14, while the second electrode pad 9 of the multilayer printed circuit board 8 and the electrode pad 31 on the reverse side of the insulating film 30 are connected by the solder bump 14.

In addition, to achieve the desired spacing between the semiconductor device 1 and the insulating film 30, a standoff element 34 made of a material such as Al, AlN, or SiC is formed by punching or pressing, this standoff element 34 being attached onto the semiconductor device 1 and the insulating film 30 by means of a heat-resistant adhesive 35.

In the structure that is disclosed in this Japanese Unexamined Patent Publication, between the semiconductor device 1 and the multilayer printed circuit board 8, insulating film 30 intervenes and is shifted so that the electrode pads 31 on the front and reverse sides are not opposite one another, so that it is possible to absorb in the insulating film 30 the thermal stress that occurs because of the difference in thermal expansion between the semiconductor device 1 and the multilayer printed circuit board 8.

Also, because the electrode pads 31 on the front and reverse sides of the insulating film 30 are not opposite to one another, by positioning the electrode pad 9 on the printed circuit board side further inside than the position of the electrode pad 2 of the semiconductor device 1, it is possible to make the solder bump connection area on the printed circuit board 8 small, thereby reducing the strain caused by thermal stress.

However, in the above-noted disclosed structure, the connection structure using solder bumps 14 is a double-layer structure on both sides of the insulating film 30, this requiring two times the number of solder bumps as there are connection locations, which is not desirable from the standpoint of flip-chip productivity and economy.

Also, there are standoff elements 34 with good thermal conductivity that are not electrically connected to the electrically connected solder bump 14 provided between the semiconductor device 1 and the insulating film 30, the region in which these standoff elements and solder bumps do not exist being open space.

Because the insulating film 30 is a thin layer of several tens of $\mu$m to several hundreds of $\mu$m and does not have rigidity, it is difficult to achieve a uniform flatness in the insulating film 30 between this open space area and the region in which the standoff elements and metal bumps exist, so that when mounting the semiconductor device 1 and the insulating film 30 to the surface of a multilayer printed circuit board 8, there are cases in which mutual connection is not possible at a solder bump 14 between the insulating film 30 and the multilayer printed circuit board 8, causing a reduction in reliability.

In view of the above-noted problems, an object of the present invention is to provide a mounting structure which alleviates the thermal stress which is due to a difference in thermal expansion between a semiconductor device and a mounting board such as multilayer printed circuit board, while avoiding complexity of structure and achieving high connection reliability.

SUMMARY OF THE INVENTION

To attain the objects of the present invention as mentioned above, a first aspect of the present invention basically has the following technical construction in that a flip-chip mounting structure for a semiconductor device in which a semiconductor device which is provided with a first electrode pad on a mounting surface thereof and a mounting board such as a multilayer printed circuit board which is provided with a second electrode pad on a surface thereof, are connected to each other by means of a metal bump, the mounting structure comprising, a first insulating means having a first conductive layer being arranged inside thereof, is formed on a front surface of the semiconductor device, and a second insulating means having a second conductive layer being arranged inside thereof, is formed on the front surface of the mounting board, and wherein the first electrode pad is connected to the metal bump through the first conductive layer and the second electrode pad is connected to the metal bump through the second conductive layer.

In accordance with a second aspect of the present invention, a flip-chip mounting structure has specifically has the following technical features in that the mounting structure further comprising a first insulating resin layer which is formed on a front surface of the semiconductor device, a first metal bump electrode pads to be electrically connected to the first electrode pad being formed onto a front surface of the first insulating resin layer, and a second insulating resin layer which is formed on the front surface of the mounting board, a second metal bump electrode pads to be electrically connected to the second electrode pad being formed on a top surface of the second insulating resin layer, the first and second metal bump electrode pads being mutually connected by the metal bumps, a semiconductor device which is provided with first electrode pads and a mounting board such as a multilayer printed circuit board which is provided with second electrode pads are connected by means of metal bumps, in which a first insulating resin layer is formed on the front surface of the semiconductor device, first electrode pads for metal bumps to be electrically connected to the above-noted first electrode pad being formed onto the front surface of this first insulating resin layer, a second insulating resin layer being formed on the front surface of the mounting board, second electrode pads for metal bumps to be electrically connected to the above-noted second electrode pad being formed on the top surface of this second insulating resin layer, and the above-noted first and second metal bump electrode pads being mutually connected by above-noted metal bumps.

In the case in which the metal bumps are solder, it is desirable that the first and second insulating resin layers and the surface insulating resin layer be made of polyimide.

It is also desirable that resin be poured in the space between the opposing first insulating resin layer on the top of the semiconductor device and the second insulating resin layer on the top of the multilayer printed circuit board.

In the present invention, at least one of the first and second insulating resin layers can have a film carrier which is formed as a conductive film onto the resin layer, this film carrier being adhered to either the semiconductor device or the front surface of the multilayer printed circuit board.

DETAILED DESCRIPTION OF THE PREFERRED EMBODIMENTS

Next, embodiments of the present invention will be described in detail, with reference being made to the relevant accompanying drawings.

Figure 1:
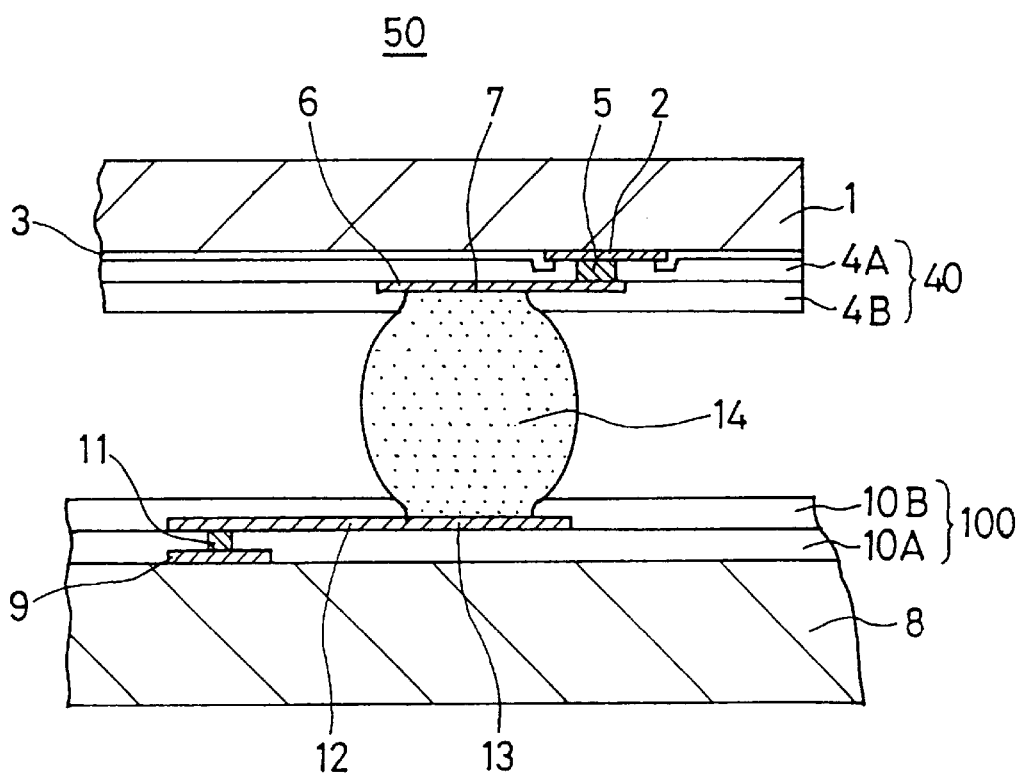
FIG. 1 is a cross-sectional view of the first embodiment of the present invention.

FIG. 1 is a cross-sectional view of a basic technical construction of the flip-chip mounting structure for a semiconductor device of the present invention is disclosed.

In that, it is shown that the flip-chip mounting structure for a semiconductor device 50 in which a semiconductor device 1 which is provided with a first electrode pad 2 on a mounting surface thereof and a mounting board 8 such as a multilayer printed circuit board which is provided with a second electrode pad 13 on a surface thereof, are connected to each other by means of a metal bump 14, the mounting structure comprising, a first insulating means 40 having a first conductive wiring pattern 6 being arranged inside thereof, is formed on a front surface of the semiconductor device 1, and a second insulating means 100 having a second conductive wiring pattern 12 being arranged inside thereof, is formed on the front surface of the mounting board 8, and wherein the first electrode pad 2 is connected to the metal bump 14 through the first conductive wiring pattern 6 and the second electrode pad 13 is connected to the metal bump 14 through the second conductive wiring pattern 12.

As shown in FIG. 1 and from the related explanation thereof as mentioned hereunder, each of the first and second insulating means 40 and 100 is formed by at least two insulating resin layers 4A and 4B, and 10A and 10B stacked on each other, respectively, with the conductive wiring patterns 6 and 12 interposed therebetween.

More specifically, as shown in FIG. 1, the flip-chip mounting structure of the present invention has the following constructions, such as the mounting structure further comprises a first insulating resin layer 4A which is formed on a front surface of the semiconductor device 1, first metal bump electrode pads 7 to be electrically connected to the first electrode pad 2 being formed onto a front surface of the first insulating resin layer 4A and a second insulating resin layer 10A which is formed on the front surface of the mounting board 8, second metal bump electrode pads 13 to be electrically connected to the second electrode pad 9 being formed on a top surface of the second insulating resin layer 10A, and further, the first and second metal bump electrode pads 7, 13 being mutually connected by the metal bumps 14.

More over, as shown in FIG. 1, the first insulating resin layer 4A has a configuration in which a first wiring pattern 6 is formed on a surface thereof, over a part of which surface is provided a first through hole 5 which connects the first electrode pad 2 and the first wiring pattern 5, a first surface insulating resin layer 4B which covers the first wiring pattern 6 being provided and an aperture being formed in part of the first surface insulating resin layer 4B so as to expose part of the first wiring pattern 6 thereby forming a first metal bump electrode pad 7, and wherein the mounting board 8 has a second electrode pad 9 formed on a surface thereof, a through hole 11 provided in a part of the second insulating resin layer 10A forming and electrical connection between the second electrode pad 9 and the second wiring pattern 12 an aperture being formed in part of the second surface insulating resin layer 10B which covers the second wiring pattern 12 so as to expose part of the second wiring pattern 12, thereby forming a second metal bump electrode pad 13.

Further, as shown in FIG. 1, the semiconductor device 1 has formed onto the periphery thereof which will be its mounting surface the first electrode pads 2, a passivation film 3 being formed over the area of the semiconductor device mounting surface other than the first electrode pads 2.

Onto the surface of the semiconductor device 1 is formed a first insulating resin layer 4A made of heat-resistant resin, to a thickness of several tens of $\mu$m.

This first insulating resin layer 4A can be formed, for example, by applying a given amount of liquid polyimide and covering with this material using spin coating, after which the material is cured.

In the positions of the first electrode pads 2 apertures are formed, and on the surface of the first insulating resin layer 4A which includes these apertures, a metal layer is formed by plating or sputtering, for example, of a metal such as copper or gold, this being etched to form a first through hole 5 at the above-noted apertures, the first wiring pattern 6 being formed as one with this first through hole 5.

In addition, on the top of this surface liquid polyimide is again applied as a cover film, this being cured to form a first surface insulating resin layer 4B, this further being patterned to exposed a part of the first wiring pattern 6 by providing an aperture having a diameter of 0.15 mm Φ, thereby forming the first metal bump electrode pad 7.

A multilayer printed circuit board 8 of $Al_2O_3$ or the like is used as the mounting board, a second electrode pad 9 being formed onto the surface thereof.

Onto the surface of this multilayer printed circuit board 8, heat-resistant resin to a thickness of several tens of μm is formed by using, for example, the same method as used to form the above-noted first insulating resin layer, applying liquid resin thereto and curing it to form a second insulating resin layer 10A.

An aperture is provided at the position of the second electrode pad 9, and a metal such as copper or gold is formed as a metal layer onto the second insulating resin layer 10A which includes this aperture, by the process of plating, sputtering, or the like, this being then etched to form a second through hole 11 at the above-noted aperture, a second wiring pattern 12 being further formed as one with this second through hole 11.

On top of the above surface, liquid polyimide is applied as a cover film this being cured to form a second surface insulating resin layer 10B, this being further patterned to expose part of the second wiring pattern 12, thereby forming a second metal bump electrode pad 13 which is in opposition to the first metal bump electrode pad 7 of the semiconductor device. The diameter of the second metal bump electrode pad 13 is 0.15 mm Φ.

At least one of the first metal bump electrode pad 7 on a surface of the semiconductor device and the second metal bump electrode pad 13 of the multilayer printed circuit board, for example the first metal bump electrode pad 7, has solder paste applied to it by, for example, by solder printing, after which a reflow oven or the like is used to melt the solder, thereby forming a solder ball having a diameter of approximately 0.18 mm Φ.

After that is done, the semiconductor device is superposition over the multilayer printed circuit board so as to enable connection between the opposing first metal bump electrode pad 7 and the second metal bump electrode pad 13, these being then passed through a reflow oven, to melt the solder again and form a solder bump 14, thereby making an electrical connection between the first metal bump electrode pad 7 and the second metal bump electrode pad 13, which achieves the flip-chip connection.

In this flip-chip connection structure, between the first metal bump electrode pad 7 to which one end of the solder bump 14 is connected and the semiconductor device, there exists the first insulating resin layer 4A, with the periphery of that end of the solder bump being surrounded by the first surface insulating resin layer 4B.

In the same manner, between the second metal bump electrode pad 13 to which the other end of the solder bump 14 is connected and the multilayer printed circuit board 8, there exist the second insulating resin layer 10A, with the periphery of that other end of the solder bump 14 being surrounded by second insulating resin layer 10B.

Because the first and second insulating resin layers 4A and 10A and the surface insulating resin layers 4B and 10B are made of polyimide, which is flexible with respect to stress, it is possible to absorb thermal stress which occurs because of a difference in thermal expansion between the semiconductor device 1 and the multilayer printed circuit board 8, thereby reducing the amount of stress that is applied to the solder bump 14.

By doing this, the connection between the solder bump 14 and each of the metal bump electrode pads 7 and 13 is maintained even in the presence of thermal stress, the reliability of the connection being thus improved.

Figure 4:
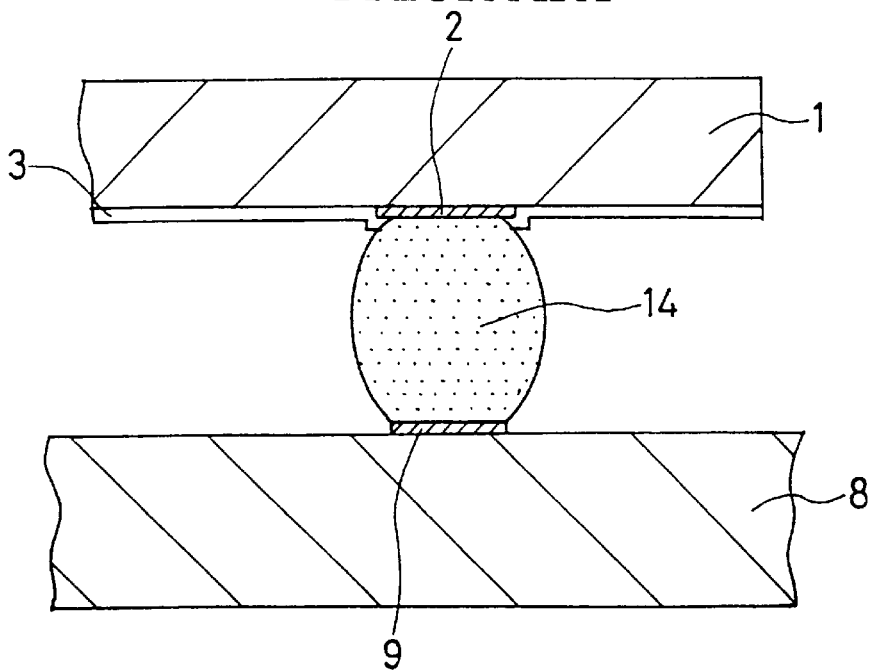
FIG. 4 is a cross-sectional view of an example of a mounting structure in the past.

In a stress simulation performed by the inventor, it was seen that, by using the structure shown in FIG. 1, it is possible to reduce the thermal stress applied to the areas at both sides of the solder bump to approximately one-third of the stress in the structure without a polyimide layer which is shown in FIG. 4.

Also in temperature cycling tests, which are one form of connection reliability test, it was possible to obtain an approximate two-fold improvement in the connection life over that of the structure of the past which did not have a polyimide layer.

Figure 2:
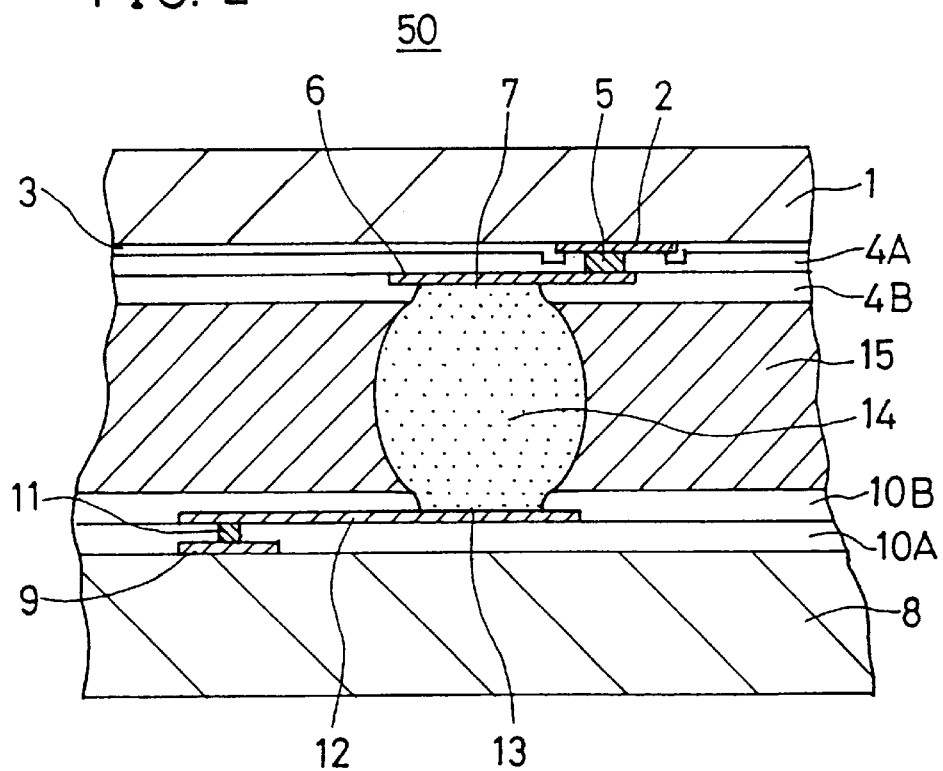
FIG. 2 is a cross-sectional view of an example of a variation of the embodiment of FIG. 1.

As shown in FIG. 2, if into the space between the semiconductor device 1 and the multilayer printed circuit board 8, that is, the space between the first surface insulating resin layer 4B over the surface of the semiconductor device 1 and the second surface insulating resin layer 10B over the surface of the multilayer printed circuit board 8, an epoxy-type resin 15 that has a thermal expansion coefficient that approximates that of the solder, thermal stress accompanying thermal hysteresis will be absorbed by this resin 15 as well, so that the stress applied to the solder bump 14 is further alleviated, thereby enabling a further extension of the life of the flip-chip connection structure.

Figure 5:
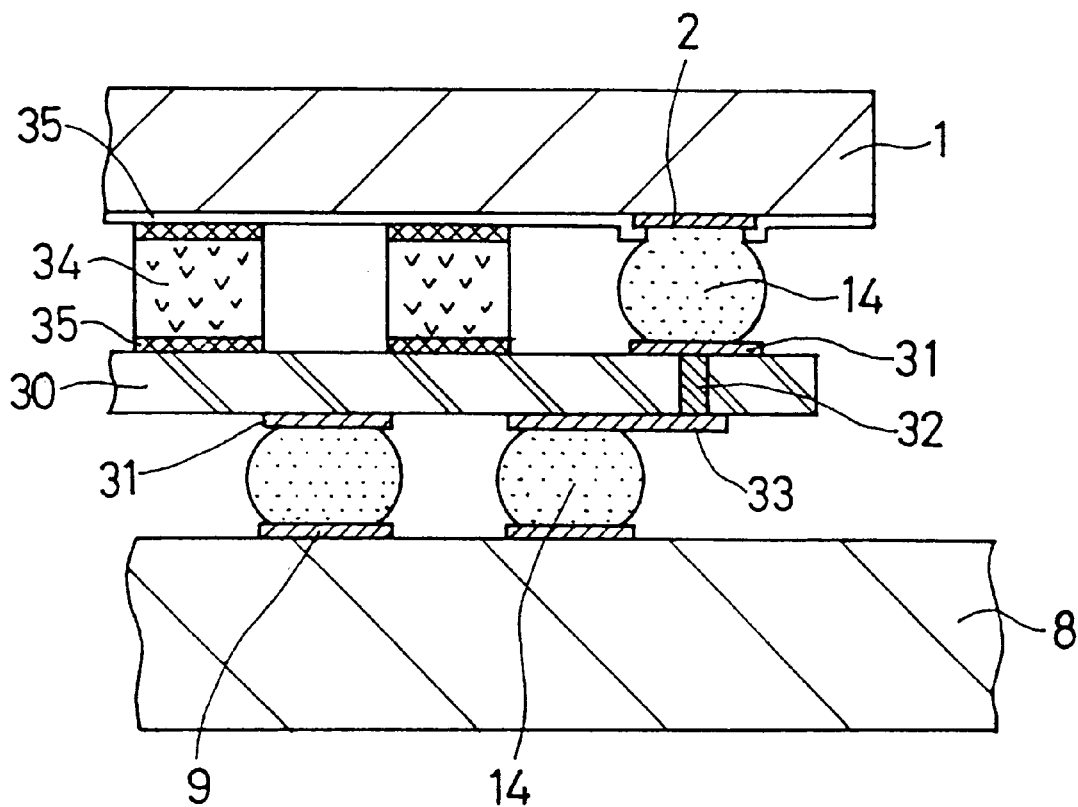
FIG. 5 is a sectional view of another example of a mounting structure in the past.

In this embodiment of the present invention, because there is one layer of solder bumps, it offers an advantage in terms of assembly when compared with the structure which is shown in FIG. 5.

Additionally, because the each of the insulating resin layers 4A, 4B, 10A, and 10B provided on the surfaces of the semiconductor device 1 and on the surface of the multilayer printed circuit board 8 can be provided with uniform flatness, using thin-film technology, there is no open space area therebetween, making it possible to maintain uniformity of the height of the solder bumps 14, thereby facilitating interconnection between solder bumps.

Furthermore, because the first insulating resin layer 4A and the surface insulating resin layer 4B on the surface of the semiconductor device 1 are formed over a wafer as a unit fabrication, the manufacturing cost of the insulating resin layers for each chip can be greatly reduced.

Figure 3:
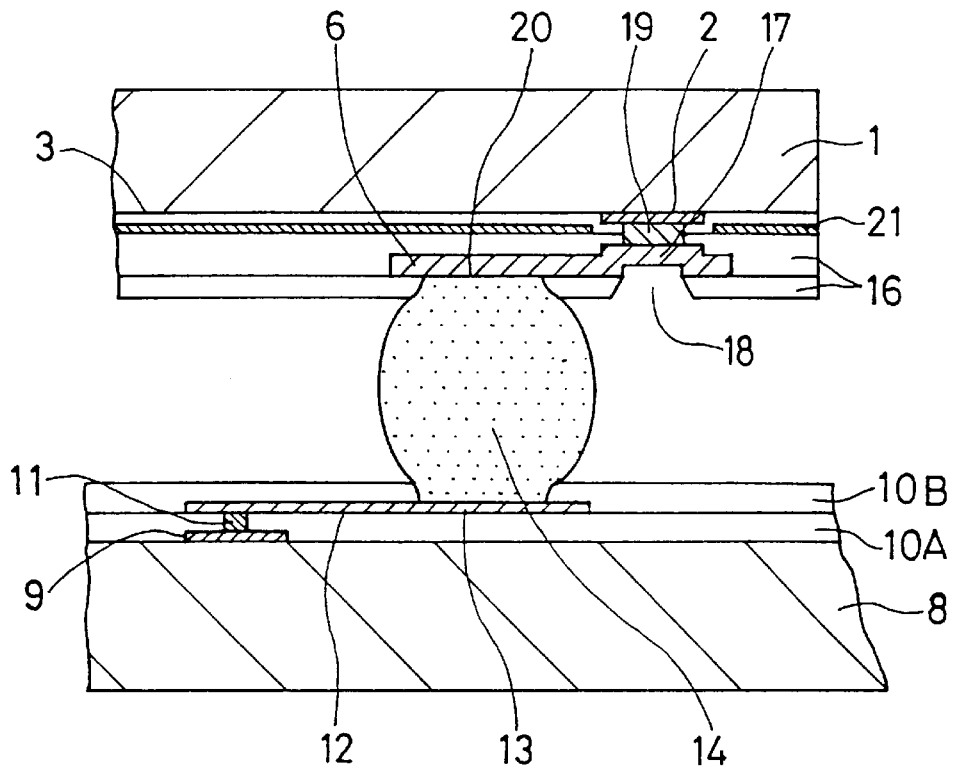
FIG. 3 is a cross-sectional view of the second embodiment of the present invention.

Next, the second embodiment of the present invention will be described, with reference being made to the relevant accompanying drawings. FIG. 3 is a cross-sectional view of the second embodiment, in which elements that are equivalent to elements in the first embodiment have been assigned the same reference numerals.

In this second embodiment, a film carrier made from an organic film such as a polyimide resin or the like is used as the first insulating resin film which is provided on the surface of the semiconductor device 1.

That is, this film carrier is made from a two-layer material comprising a polyimide organic insulating film 16 and a metal foil 17 made of copper or the like, a through hole 19 capable of connection to a first electrode pad 2 on the surface of the semiconductor device 1, an aperture 18 at a position corresponding to directly beneath this through hole region, and a first metal bump electrode pad 20 which is for the purpose of metal bump connection, this being part of a metal wire which is patterned onto the above-noted metal foil 17, being further formed.

The above-noted through hole 19 is formed by filling the aperture provided in the film 16 with metallic material, this being formed as one with the metal wire 17.

After positioning together the through hole 19 of the film carrier and the first electrode pad 2 on the surface of the semiconductor device 1, a single-point bonder of the type generally used with TAB connections is used, ultrasonic bonding being performed of the upper part of the aperture 18 of the film, thereby joining the first electrode pad 2 and the through hole 19.

By doing this, the first electrode pad 2 on the surface of the semiconductor device 1 is electrically connected to the first metal bump electrode pad 20, via the through hole 19 and metal wire 17.

Similar to the case of the first embodiment, the multilayer printed circuit board is a multilayer printed circuit board made of $Al_2O_3$, and onto the surface of which is formed a second insulating resin layer 10A made of polyimide, which is provided with a second through hole 11 of a metal such as copper or gold, a second wire 12, and a patterned second metal bump electrode pad 13, and a surface insulating resin layer 10B made of polyimide.

Therefore, using the same method as in the case of the first embodiment, a solder bump 14 is formed either one of the metal bump electrode pads 20 and 13 on the top of the semiconductor device 1 and on the top of the multilayer printed circuit board 8, respectively, this solder bump 14 being positioned at the other metal bump electrode pad, so that solder bump connects together the metal bump electrode pads 20 and 13, thereby effecting the mounting of the semiconductor device.

By doing this, the same effect as with the first embodiment is achieved, and it is possible to achieve a reduction in the stress value and a great lengthening of the connection life.

Additionally, because unlike the first embodiment thin-film forming technology is not employed, although there is a slight disadvantage in the quality of the fine patterning, by using a film carrier there is a simplification of the forming of an insulating resin layer on the surface of the semiconductor device.

In this second embodiment, as shown in the drawing, to improve the intimate contact of the passivation film 3 on the surface of the organic insulating film 16 and the semiconductor device 1, it is possible to use an adhesive film 21 in the space therebetween.

In another aspect of the present invention, a method for producing a flip-chip mounting structure for a semiconductor device is provided and in that a method thereof comprising the steps of, providing a first insulating means having a first conductive layer being arranged inside thereof, to form an insulating layer on a front surface of said semiconductor device, and providing a second insulating means having a second conductive layer being arranged inside thereof, to form an insulating layer on a front surface of the mounting board, connecting said first electrode pad to said metal bump through said first conductive layer in said first insulating means, and connecting said second electrode pad to said metal bump through said second conductive layer in said second insulating means.

And the method therefore further characterized in that the method comprises the steps of, forming a first insulating resin layer on a front surface of said semiconductor device, forming first metal bump electrode pads to be electrically connected to said first electrode pad on a front surface of said first insulating resin layer, forming a second insulating resin layer on the front surface of the mounting board, forming second metal bump electrode pads to be electrically connected to said second electrode pad on a top surface of said second insulating resin layer, and connecting said first and second metal bump electrode pads mutually to each other by said metal bumps.

While the above is a description of specific embodiments of the present invention, it will be obvious to a person skilled in the art that variations of the present invention are possible, as long as they remain within the scope of the essence and purport thereof.

For example, a variety of different methods and materials can be applied to the material of the first insulating resin layer, the second insulating resin layer and the method of formation thereof, to the material of the metal bumps and the method of formation of the metal bumps on the semiconductor device and the multilayer printed circuit board, and to the material of the multilayer printed circuit board.

As described in detail above, when used as a flip-chip pad connection method in which a semiconductor device and a mounting board are connected by means of metal bumps, because the mounting structure of the present invention has insulating resin layers that are formed directly beneath the respective metal bump electrode pads of the semiconductor device and the mounting board, thermal stress that develops because of a difference in thermal expansion between the semiconductor device and the mounting board is absorbed by these insulating resin layers, thereby reducing the stress applied to the metal bumps, this achieving the effect of greatly increasing the connection life of the metal bumps.

What is claimed is:

1. A flip-chip mounting structure for a semiconductor device in which a semiconductor device which is provided with a first electrode pad on a mounting surface thereof and a mounting board which is provided with a second electrode pad on a surface thereof, are connected to each other by means of a metal bump, said mounting structure comprising:

a first insulating means having a first conductive wiring pattern arranged inside thereof, formed on a front surface of said semiconductor device, and;

a second insulating means having a second conductive wiring pattern arranged inside thereof, formed on the front surface of the mounting board, wherein each of said first and second insulating means is formed by at least two insulating resin layers stacked on each other with said first and second conductive wiring patterns respectively interposed therebetween, a first insulating resin layer formed on a front surface of said semiconductor device, with first metal bump electrode pads to be electrically connected to said first electrode pad being formed onto a front surface of said first insulating resin layer, and a second insulating resin layer formed on the front surface of the mounting board, with second metal bump electrode pads to be electrically connected to said second electrode pad being formed on a top surface of said second insulating resin layer, said first and second metal bump electrode pads being mutually connected by said metal bumps;

said first electrode pad being offset connected to said metal bump through said first conductive wiring pattern and said second electrode pad being offset connected to said metal bump through said second conductive wiring pattern.

2. A semiconductor device mounting structure according to claim 1, wherein said first insulating resin layer has a configuration in which a first wiring pattern is formed on a surface thereof, over a part of which surface is provided a through hole through which said first electrode pad and said first wiring pattern are connected, a first surface insulating resin layer which covers said first wiring pattern being provided and an aperture being formed in part of said first surface insulating resin layer so as to expose part of said first wiring pattern thereby forming a first metal bump electrode pad, and wherein said mounting board has a second wiring pattern formed on a surface thereof, a through hole provided in a part of said second surface insulating resin layer through which an electrical connection between said second electrode pad and said second wiring pattern is formed, an aperture being formed in part of said second surface insulating resin layer which covers said second wiring pattern so as to expose part of said second wiring pattern, thereby forming a second metal bump electrode pad.

3. A semiconductor device mounting structure according to claim 1, wherein said first insulating means and said second insulating means are disposed in spaced opposition to one another, and further comprising a resin layer formed in the space between said first insulating means over said semiconductor device and said second insulating means over said mounting board.

4. A semiconductor device mounting structure according to claim 1, wherein a film carrier formed of an electrically conductive film is formed on at least one of said first insulating layer and said second insulating layer, said film carrier being adhered to a surface of either said semiconductor device or said mounting board.

5. A semiconductor device mounting structure according to claim 2, wherein said metal bump comprises solder, and wherein said first and second insulating resin layers and said first and second surface insulating resin layers comprise a polyimide resin.

6. A flip-chip mounting structure for a semiconductor device in which a semiconductor device which is provided with a first electrode pad on a mounting surface thereof and a mounting board which is provided with a second electrode pad on a surface thereof, are connected to each other by means of a metal bump, said mounting structure comprising:

a first insulating means comprising at least two stacked insulating layers having a first conductive wiring pattern interposed therebetween, formed on a front surface of said semiconductor device, and including first metal bump electrode pads to be electrically connected to said first electrode pad formed on a front surface of said first insulating means, a second insulating means comprising at least two stacked insulating layers having a second conductive wiring pattern interposed therebetween, formed on the front surface of the mounting board, and including second metal bump electrode pads to be electrically connected to said second electrode pad formed on a top surface of said second insulating means, wherein said first and second metal bump electrode pads are mutually connected by said metal bumps, and said first insulating resin layer has a configuration in which said first wiring pattern is formed on a surface thereof, over a part of which surface is provided a through hole through which said first electrode pad and said first wiring pattern are connected, a first surface insulating layer which covers said first wiring pattern being provided and an aperture being formed in part of said first surface insulating layer so as to expose part of said first wiring pattern thereby forming a first metal bump electrode pad, and wherein said mounting board has a second wiring pattern formed on a surface thereof, a through hole provided in a part of said second surface insulating layer through which an electrical connection between said second electrode pad and said second wiring pattern is formed, an aperture being formed in part of said second surface insulating layer which covers said second wiring pattern so as to expose part of said second wiring pattern, thereby forming a second metal bump electrode pad, and wherein said first electrode pad is connected to said metal bump through said first conductive layer and said second electrode pad is connected to said metal bump through said second conductive layer.

7. A semiconductor device mounting structure according to claim 6, wherein said metal bump comprises solder, and wherein said first and second insulating layers and said first and second surface insulating layers comprise a polyimide resin.

8. A semiconductor device mounting structure according to claim 6, said first insulating means and said second insulating means are disposed in spaced opposition to one another, and further comprising a resin poured into the space between said first insulating means over said semiconductor device and said second insulating means over said multi-layer printed circuit board.

9. A semiconductor device mounting structure according to claim 6, wherein a film carrier formed of an electrically conductive film is formed on at least one of said first insulating layer and said second insulating layer, said film carrier being adhered to a surface of either said semiconductor device or said mounting board.

10. A flip-chip mounting structure for a semiconductor device in which a semiconductor device which is provided with a first electrode pad on a mounting surface thereof and a mounting board which is provided with a second electrode pad on a surface thereof, are connected to each other by means of a metal bump, said mounting structure comprising:

a first insulating means comprising first and second stacked insulating layers, and having a first conductive wiring pattern arranged inside thereof, formed on a front surface of said semiconductor device, and;

a second insulating means comprising first and second stacked insulating layers, and having a second conductive wiring pattern arranged inside thereof, formed on the front surface of the mounting board, said first electrode pad being offset connected to said metal bump through said first conductive wiring pattern and said second electrode pad being offset connected to said metal bump through said second conductive wiring pattern, wherein each of said first and second insulating means is formed by at least two insulating resin layers stacked one on top of the other with said first and second conductive wiring patterns respectively interposed therebetween.

11. A flip-chip mounting structure according to claim 10, wherein said mounting structure further comprises:

a first insulating resin layer formed on a front surface of said semiconductor device, with first metal bump electrode pads to be electrically connected to said first electrode pad being formed onto a front surface of said first insulating resin layer, and a second insulating resin layer formed on the front surface of the mounting board, with second metal bump electrode pads to be electrically connected to said second electrode pad being formed on a top surface of said second insulating resin layer, said first and second metal bump electrode pads being mutually connected by said metal bumps.

12. A semiconductor device mounting structure according to claim 10, wherein said first insulating means and said second insulating means are disposed in spaced opposition to one another, and further comprising a resin poured into the space between said first insulating means over said semiconductor device and said second insulating means over said mounting board.

13. A semiconductor device mounting structure according to claim 11, wherein said metal bump electrode pads comprise solder, and wherein said first and second insulating resin layers and said first and second surface insulating resin layers comprise a polyimide resin.

14. A semiconductor device mounting structure according to claim 11, wherein a film carrier formed of an electrically conductive film is formed on at least one of said first insulating layer and said second insulating layer, said film carrier being adhered to a surface of either said semiconductor device or said mounting board.

15. A flip-chip mounting structure for a semiconductor device in which a semiconductor device which is provided with a first electrode pad on a mounting surface thereof and a mounting board which is provided with a second electrode pad on a surface thereof, are connected to each other by means of a metal bump, said mounting structure comprising:

a first insulating means having a first conductive wiring pattern arranged inside thereof, formed on a front surface of said semiconductor device, and;

a second insulating means having a second conductive wiring pattern arranged inside thereof, formed on the front surface of the mounting board, said first electrode pad being offset connected to said metal bump through said first conductive wiring pattern and said second electrode pad being offset connected to said metal bump through said second conductive wiring pattern, wherein said first insulating means and said second insulating means are disposed in spaced opposition to one another, and further comprising a resin layer formed in the space between said first insulating means over said semiconductor device and said second insulating means over said mounting board.

* * * * *